(12) United States Patent
Kung

(10) Patent No.: US 8,779,827 B2
(45) Date of Patent: Jul. 15, 2014

(54) DETECTOR CIRCUIT WITH LOW THRESHOLD VOLTAGE AND HIGH VOLTAGE INPUT

(71) Applicant: Power Integrations, Inc., San Jose, CA (US)

(72) Inventor: David Kung, Foster City, CA (US)

(73) Assignee: Power Integrations, Inc., San Jose, CA (US)

( * ) Notice: Subject to any disclaimer, the term of this patent is extended or adjusted under 35 U.S.C. 154(b) by 0 days.

(21) Appl. No.: 13/630,777

(22) Filed: Sep. 28, 2012

(65) Prior Publication Data

US 2014/0091859 A1    Apr. 3, 2014

(51) Int. Cl.
*H03K 5/08*    (2006.01)

(52) U.S. Cl.
USPC ............................................ 327/309; 327/321

(58) Field of Classification Search
USPC .................................. 327/309, 310, 313, 321
See application file for complete search history.

(56) References Cited

U.S. PATENT DOCUMENTS

| | | | | |
|---|---|---|---|---|
| 4,937,700 A * | 6/1990 | Iwahashi | | 361/56 |
| 5,208,488 A * | 5/1993 | Takiba et al. | | 327/77 |
| 5,278,458 A * | 1/1994 | Holland et al. | | 327/77 |
| 5,994,950 A * | 11/1999 | Ochi | | 327/543 |
| 6,522,511 B1 * | 2/2003 | John et al. | | 361/56 |
| 6,552,595 B1 * | 4/2003 | Ma | | 327/313 |
| 6,677,809 B2 * | 1/2004 | Perque et al. | | 327/541 |
| 7,145,364 B2 * | 12/2006 | Bhattacharya et al. | | 326/68 |
| 7,576,396 B2 | 8/2009 | Alberkrack et al. | | |
| 7,940,107 B2 * | 5/2011 | Chen et al. | | 327/312 |
| 8,044,611 B2 * | 10/2011 | Tanaka | | 315/297 |
| 8,305,130 B2 * | 11/2012 | Fischer | | 327/321 |
| 8,432,144 B2 * | 4/2013 | Notani | | 323/280 |
| 2004/0109270 A1 * | 6/2004 | Stockinger et al. | | 361/56 |

* cited by examiner

*Primary Examiner* — Thomas J Hiltunen
(74) *Attorney, Agent, or Firm* — Blakely Sokoloff Taylor & Zafman LLP

(57) ABSTRACT

An integrated circuit includes a high voltage transistor having a first terminal coupled to sense a high voltage terminal and a control terminal coupled to a regulated voltage, which is regulated with respect to a ground terminal and is substantially less than a high voltage that the high voltage terminal is adapted to withstand. A logic gate is also included and is coupled to be powered from the regulated voltage. The logic gate has an input threshold that is less than the regulated voltage. An input terminal of the logic gate is coupled to a second terminal of the high voltage transistor. An output of the logic gate is coupled to indicate that a voltage sensed between the high voltage terminal and the ground terminal is less than the input threshold voltage of the logic gate.

16 Claims, 3 Drawing Sheets

DETECTOR CIRCUIT WITH LOW THRESHOLD VOLTAGE AND HIGH VOLTAGE INPUT

BACKGROUND INFORMATION

1. Field of the Disclosure

The present invention relates generally to integrated circuits, and more particularly, the present invention is related to integrated circuits that operate in applications where high voltages may be present between terminals of the integrated circuit.

2. Background

Integrated circuits for power supplies, motor drives, light emitting diode (LED) lighting, and similar applications typically operate with high voltage applied between at least two terminals of the integrated circuit. The voltage may vary between zero and several hundred volts, and the terminals may be exposed to positive and negative polarities. To meet requirements for small size and low cost, nearly all the components within the integrated circuit must be designed for much lower voltages. In a typical example, the internal circuits may operate at less than 6 volts, and they may be damaged if they are exposed to more than 9 volts. Therefore, integrated circuits may have components that operate with relatively low voltage as well as components that must operate with relatively high voltage.

The terminals of some integrated circuits that operate at high voltage may be only the terminals of a controlled switch, whereas other terminals may need to sense a high voltage rather than just switch a high voltage. For example, it may be necessary for the integrated circuit to sense when the high voltage falls to a relatively low threshold value, or for example when the voltage changes polarity. Such sensing may be required to detect zero-crossings of ac voltages for timing purposes, or the sensing may be required to detect impending negative voltage for the purpose of activating protective clamp circuits.

The task of sensing is much more difficult than the task of switching, particularly when the sensing must be fast and accurate. An economical solution is needed for integrated circuits to detect with speed and accuracy the event of a voltage at a high-voltage terminal reaching a relatively low threshold value.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Figure 1:
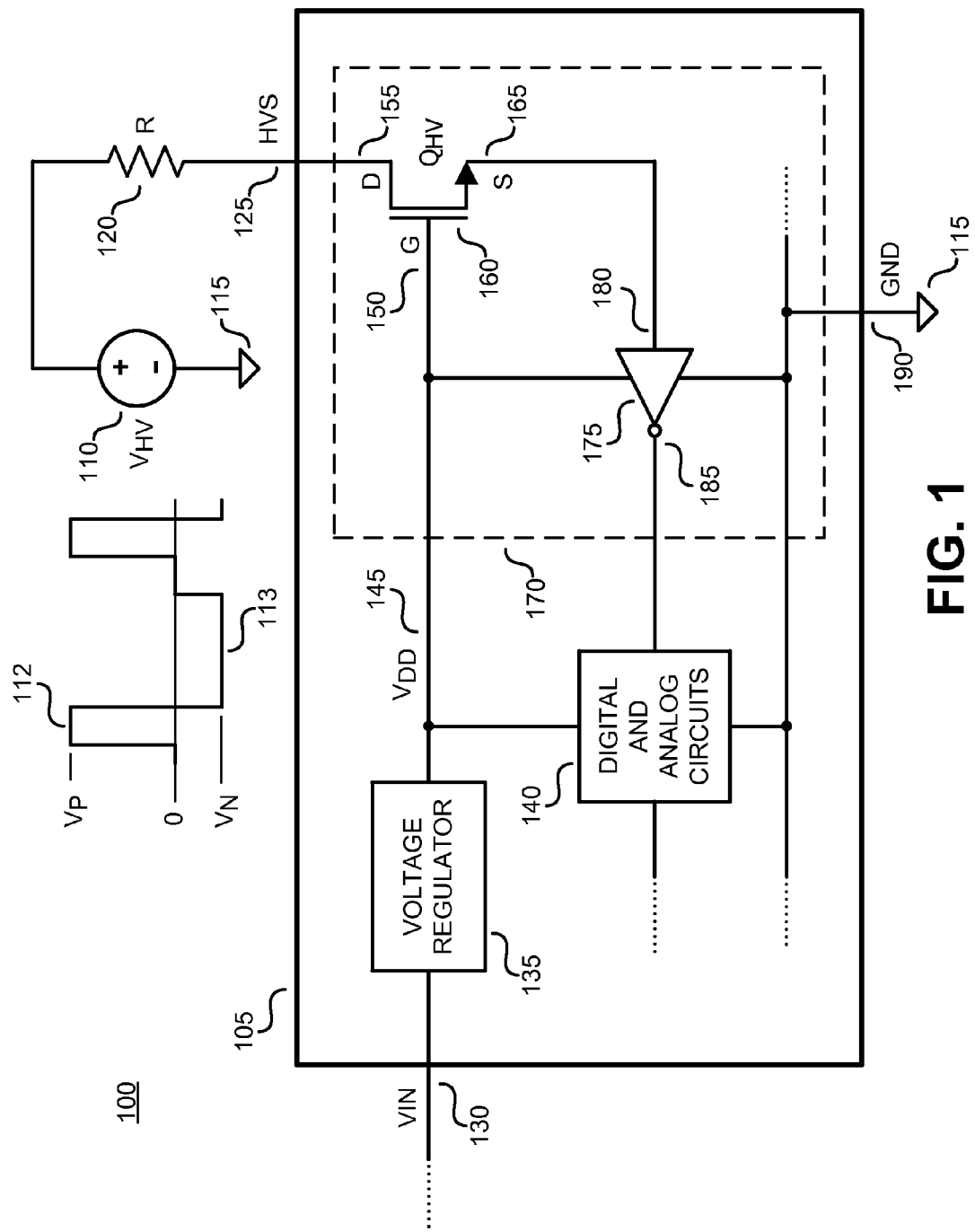
FIG. 1 is a schematic diagram of an example integrated circuit with a high voltage input illustrating a voltage detector in accordance with the teachings of the present invention.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

In the following description, numerous specific details are set forth in order to provide a thorough understanding of the present invention. It will be apparent, however, to one having ordinary skill in the art that the specific detail need not be employed to practice the present invention. In other instances, well-known materials or methods have not been described in detail in order to avoid obscuring the present invention.

Reference throughout this specification to "one embodiment", "an embodiment", "one example" or "an example" means that a particular feature, structure or characteristic described in connection with the embodiment or example is included in at least one embodiment of the present invention. Thus, appearances of the phrases "in one embodiment", "in an embodiment", "one example" or "an example" in various places throughout this specification are not necessarily all referring to the same embodiment or example. Furthermore, the particular features, structures or characteristics may be combined in any suitable combinations and/or subcombinations in one or more embodiments or examples. Particular features, structures or characteristics may be included in an integrated circuit, an electronic circuit, a combinational logic circuit, or other suitable components that provide the described functionality. In addition, it is appreciated that the figures provided herewith are for explanation purposes to persons ordinarily skilled in the art and that the drawings are not necessarily drawn to scale.

FIG. 1 is a schematic diagram 100 showing an example integrated circuit 105 that includes a detector circuit 170 in accordance with the present invention. In one example, integrated circuit 105 also includes a control circuit for use in a power supply. In the example of FIG. 1, integrated circuit 105 senses high voltage at a high voltage terminal HVS 125 with respect to a ground terminal GND 190 that is also coupled to a common return 115. A high voltage terminal of an integrated circuit, such as high voltage terminal HVS 125, is adapted to withstand more than 30 volts with respect to the ground terminal without damage. It is appreciated that a high voltage terminal may be external to the integrated circuit such as for example the terminal HVS 125 in the example of FIG. 1, or it may be internal to the integrated circuit. In addition, it will be appreciated that external and internal high voltage terminals may be coupled to additional circuits that may perform other functions besides sensing such as for example switching a voltage or for example regulating a voltage of a power supply.

The high voltage terminal HVS 125 of integrated circuit 105 in the example of FIG. 1 is coupled to one end of a current limiting resistor R 120. The other end of current limiting resistor R 120 in the example of FIG. 1 is coupled to the positive terminal of a voltage source $V_{HV}$ 110. The negative terminal of the voltage source $V_{HV}$ 110 in the example of FIG. 1 is coupled to the common return 115. Voltage source $V_{HV}$ 110 in the example of FIG. 1 produces a positive voltage $V_P$ 112 and a negative voltage $V_N$ 113 with respect to the common return terminal 115.

Integrated circuit 105 in the example of FIG. 1 receives power at a supply terminal VIN 130 that may in some examples be coupled to a source of high voltage with respect to the GND terminal 190. A voltage regulator 135 in the example integrated circuit of FIG. 1 produces a regulated voltage $V_{DD}$ 145 from the voltage received at the supply terminal VIN 130. The regulated voltage $V_{DD}$ 145 is distributed throughout the integrated circuit, and is utilized to provide regulated power to low voltage circuits included in the integrated circuit. Regulated voltage $V_{DD}$ 145 is substantially less than the high voltages that may appear at high voltage terminal HVS 190 of integrated circuit 105. As mentioned above, high voltage terminal HVS 125 may be exposed to voltages greater than 30 volts. In one example, the regulated voltage $V_{DD}$ 145 is approximately 5.8 volts. In another example, the regulated voltage $V_{DD}$ 145 is approximately 4.4 volts.

The detector circuit 170 in the example of FIG. 1 includes a high voltage n-channel enhancement mode metal oxide semiconductor field effect transistor (MOSFET) $Q_{HV}$ 160 and a logic inverter 175. High voltage transistor $Q_{HV}$ 160 has a gate G 150 coupled to regulated voltage $V_{DD}$ 145, a drain D 155 coupled to the high voltage terminal HVS 125, and a source S 165 coupled to the input 180 of logic inverter 175. The output 185 of logic inverter 175 is coupled to other digital and analog circuits 140. Details that will be addressed later are omitted from FIG. 1 to avoid obscuring the functional elements of the teachings of the present invention.

Logic inverter 175 in the example integrated circuit 105 of FIG. 1 is coupled to receive power from regulated voltage $V_{DD}$ 145 and has an input threshold $V_{LTH}$. In operation, the output 185 of logic inverter 175 is a logic high level when the voltage at the input 180 is less than the input threshold $V_{LTH}$, and the output 185 of logic inverter 175 is a logic low level when the voltage at the input 180 is greater than the input threshold $V_{LTH}$. Therefore, logic inverter 175 may be a detector that detects when the voltage at its input 180 is below a threshold $V_{LTH}$. Whereas the input threshold of logic gates in integrated circuits is typically half the regulated voltage $V_{DD}$ 145, logic inverter 175 in a detector circuit 170 may be designed with an input threshold between one and two volts.

When high voltage transistor $Q_{HV}$ 160 is in an ON state it may conduct current between drain 155 and source 165 in both directions. When high voltage transistor $Q_{HV}$ 160 is in an OFF state it cannot conduct current between drain 155 and source 165. High voltage transistor $Q_{HV}$ 160 is in an ON state when the voltage at the gate 150 is greater than either the voltage at the source 165 or the voltage at the drain 155 by more than a threshold voltage $V_T$. In one example the threshold voltage $V_T$ of high voltage transistor $Q_{HV}$ 160 is typically 2.5 volts.

High voltage transistor $Q_{HV}$ 160 prevents the voltage at the input 180 of logic inverter 175 from getting higher than $V_{DD}$ minus the transistor's threshold voltage $V_T$. High voltage transistor $Q_{HV}$ 160 also actively reduces the voltage at the input 180 of logic inverter 175 below the logic input threshold when the voltage on the high voltage terminal HVS 125 approaches zero volts with respect to the ground terminal GND 190.

In other words, high voltage transistor $Q_{HV}$ 160 and logic inverter 175 form a detector circuit 170 that accepts a high input voltage and provides a logic signal when the sensed input voltage becomes less than a relatively low input threshold value $V_{LTH}$. The detector circuit operates faster and more accurately than conventional circuits that use a resistor divider to scale the voltage on a terminal that senses high voltage to a reduced voltage that is compatible with the low voltage circuits of the integrated circuit. It is appreciated that the logic inverter 175 may be replaced by a different logic gate such as for example a NAND gate or for example a NOR gate or any other logic gate that has a well-defined input threshold value $V_{LTH}$.

Figure 2:
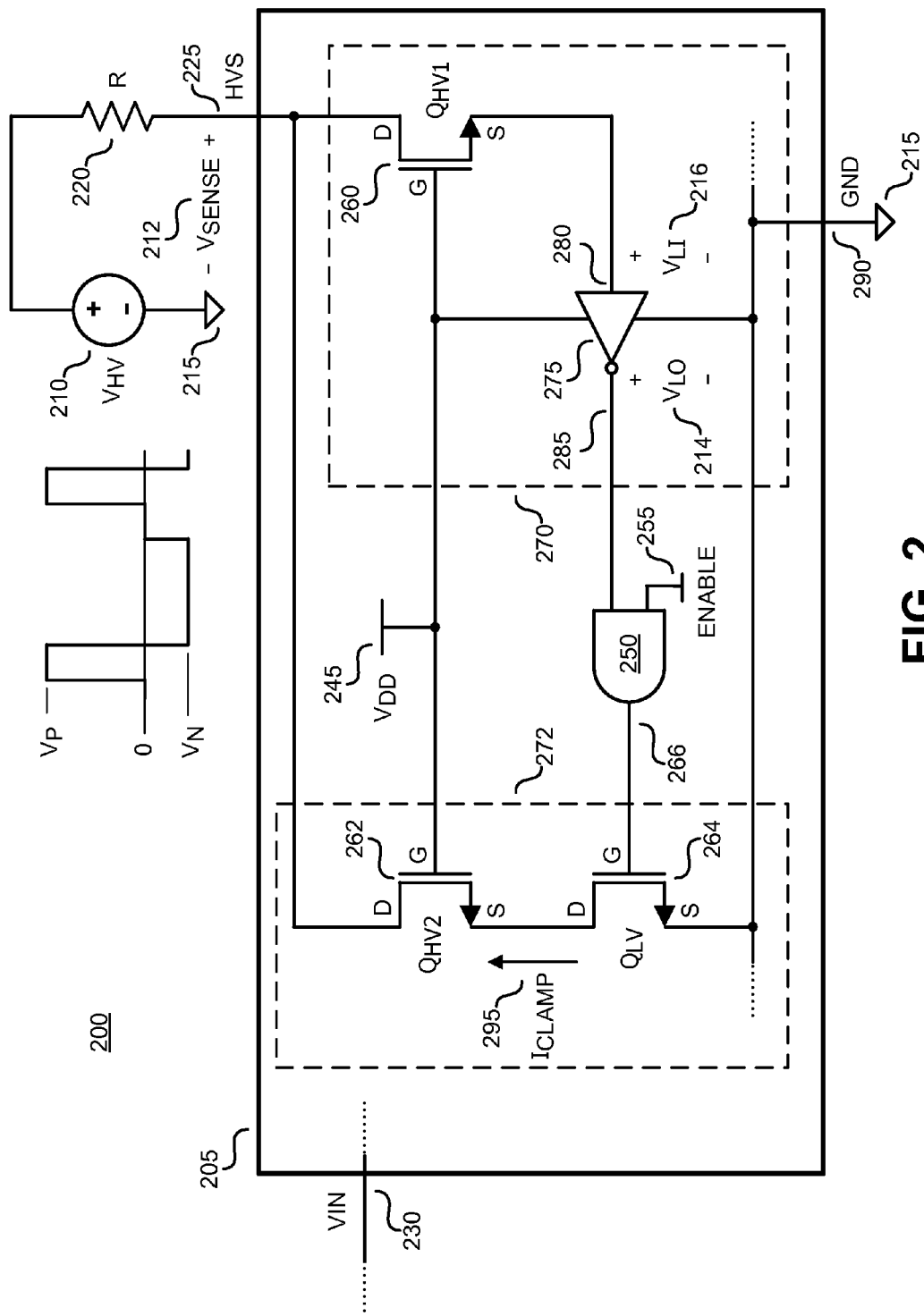
FIG. 2 is a schematic diagram of an example integrated circuit illustrating the use of a voltage detector circuit with a clamp circuit in accordance with the teachings of the present invention.

FIG. 2 is a schematic diagram 200 of an example integrated circuit 205 that uses a detector circuit 270 to enable and disable a clamp circuit 272 in accordance with the teachings of the present invention. Detector circuit 270 in the example of FIG. 2 operates in the same way as detector circuit 170 in the example of FIG. 1. Integrated circuit 205 senses a time-varying voltage from an external voltage source $V_{HV}$ 210 that has its positive terminal coupled to one end of a current limiting resistor R 220 and its negative terminal coupled to a common return 215. The other end of current limiting resistor R 220 is coupled to a high voltage terminal HVS 225 of integrated circuit 205. A voltage $V_{SENSE}$ 212 is between the high voltage terminal HVS 225 and the common return 215.

Integrated circuit 205 in the example of FIG. 2 receives a voltage at a supply terminal VIN 230 that is converted to a regulated voltage $V_{DD}$ 245 by a voltage regulator circuit not shown in FIG. 2. Integrated circuit 205 in the example of FIG. 2 has a ground terminal GND 290 that is coupled to the common return 215. In the example of FIG. 2, ground terminal GND 290 is common with the substrate of the integrated circuit 205. External voltage source $V_{HV}$ 210 may produce a voltage that is positive and negative with respect to the common return 215 that is also coupled to ground terminal GND 290, and therefore to the substrate of the integrated circuit 205.

Although high voltage transistor $Q_{HV1}$ 260 in the detector circuit 270 can protect the low voltage circuits of integrated circuit 205 from high positive voltage that may be present at high voltage terminal HVS 225, it cannot prevent a negative voltage on high voltage terminal HVS 225 from upsetting the operation of the integrated circuit 205. If the voltage at any terminal goes too far negative, there is a danger that a parasitic diode between the substrate and the terminal could become forward biased, disrupting the operation of the integrated circuit in unpredictable ways. In the example of FIG. 2, detector circuit 270 activates clamp circuit 272 to prevent the substrate diode from becoming forward biased when voltage at the high voltage sense terminal HVS 225 is negative.

In the example of FIG. 2, clamp circuit 272 includes a high voltage MOSFET $Q_{HV2}$ 262 and a low voltage MOSFET $Q_{LV}$ 264. The drain of high voltage MOSFET $Q_{HV2}$ 262 in the example clamp circuit 272 is coupled to high voltage terminal HVS 225 of integrated circuit 205. The gate of high voltage MOSFET $Q_{HV2}$ 262 in clamp circuit 272 and the gate of high voltage MOSFET $Q_{HV1}$ 260 in detector circuit 270 are coupled to a regulated voltage $V_{DD}$ 245. The source of high voltage MOSFET $Q_{HV2}$ 262 in clamp circuit 272 is coupled to the drain of low voltage MOSFET $Q_{LV}$ 264. The source of low voltage MOSFET $Q_{LV}$ 264 is coupled to GND terminal 290.

When the example clamp circuit 272 in the example of FIG. 2 is not conducting, high voltage transistor $Q_{HV2}$ 262 limits the voltage at the drain of low voltage transistor $Q_{LV}$ 264 to the regulated voltage $V_{DD}$ 245 minus the threshold voltage $V_T$ of high voltage transistor $Q_{HV2}$ 262. High voltage transistor $Q_{HV2}$ 262 is in the OFF state when low voltage transistor $Q_{LV}$ 264 is in the OFF state and the voltage at the high voltage terminal HVS 225 is higher than $V_{DD}$ 245 minus the threshold voltage $V_T$ of $Q_{HV2}$ 262. High voltage transistor $Q_{HV2}$ 262 is in the ON state when low voltage transistor $Q_{LV}$ 264 is in the ON state. In an alternative configuration, transistor 264 may be a high voltage transistor with its drain coupled directly to the high voltage terminal HVS 225, and high transistor 262 may be removed from the circuit.

When the example clamp circuit 272 in the example of FIG. 2 is conducting clamp current $I_{CLAMP}$ 295, high voltage transistor $Q_{HV2}$ 262 and low voltage transistor $Q_{LV}$ 264 limit the negative voltage at the high voltage terminal HVS 225 to the sum of the on-state source-to-drain voltage of $Q_{LV}$ 264 and $Q_{HV}$ 262.

In the example of FIG. 2, the gate of low voltage transistor $Q_{LV}$ 264 is coupled to the output 266 of an AND gate 250 that controls the state of low voltage transistor $Q_{LV}$ 264. When the output 266 of AND gate 250 is at a logic high level, transistor $Q_{LV}$ 264 is in the ON state. When the output 266 of AND gate 250 is at a logic low level, transistor $Q_{LV}$ 264 is in the OFF state.

An input of two-input AND gate 250 in the example of FIG. 2 is coupled to an ENABLE signal 255 that selects when the clamp circuit 272 can conduct. The other input of two-input AND gate 250 is coupled to the output 285 of logic inverter 275. A high logic level at the output 266 of two-input AND gate 250 is greater than the threshold voltage $V_T$ of the low voltage transistor 264. A low logic level at the output 266 of two-input AND gate 250 is less than the threshold voltage $V_T$ of the low voltage transistor 264. Therefore, clamp circuit 272 cannot conduct when the ENABLE signal 255 at the input of AND gate 250 is at a logic low level.

In one example, integrated circuit 205 also includes a control circuit that controls a power supply that produces a voltage that is represented by the voltage source $V_{HV}$ 210. Therefore, the ENABLE signal 255 may be synchronized with the timing of the transitions in the voltage represented by the voltage source $V_{HV}$ 210. In one example, AND gate 250 prevents conduction of clamp circuit 272 while the voltage source $V_{HV}$ 210 is increasing from zero to the high positive voltage $V_P$ 112.

In another example, not shown, integrated circuit 205 may include a second logic circuit similar to inverter 275 with an input also coupled to high voltage transistor $Q_{HV1}$ 260, and an output coupled to a logic circuit to provide an appropriate ENABLE signal 255 that resets the clamp circuit to a non-conducting state when the voltage on high voltage terminal HVS 225 becomes more positive than a relatively small negative voltage. A logic gate such as for example inverter 275 in the example detector circuit of FIG. 2 may be designed such that it has a negative input threshold $V_{LTH}$.

When the voltage $V_{SENSE}$ 212 between high voltage terminal HVS 225 and ground terminal GND 290 is greater than the logic input threshold $V_{LTH}$, the voltage $V_{LI}$ 216 at the input 280 of logic inverter 275 is also greater than the logic input threshold $V_{LTH}$, and the voltage $V_{LO}$ 214 at the output 285 of logic inverter 275 is at low logic level. Therefore, transistors $Q_{LV}$ 264 and $Q_{HV2}$ 262 in the example of FIG. 2 are in their OFF states when the voltage $V_{SENSE}$ 212 is greater than the logic input threshold $V_{LTH}$.

When the voltage $V_{SENSE}$ 212 between high voltage terminal HVS 225 and ground terminal GND 290 is less than the logic input threshold $V_{LTH}$, the voltage $V_{LI}$ 216 at the input 280 of logic inverter 275 is also less than the logic input threshold $V_{LTH}$, and the voltage $V_{LO}$ 214 at the output 285 of logic inverter 275 is at a high logic level. If ENABLE signal 255 at the input of two-input AND gate 250 is at a high logic level when the output 285 of logic inverter 275 is at a high logic level, the output 266 of two-input AND gate 250 will be at a high logic level. Therefore, transistors $Q_{LV}$ 264 and $Q_{HV2}$ 262 in the example of FIG. 2 are in their ON states when the ENABLE signal 255 at the input to AND gate 250 is at a logic high level and the voltage $V_{SENSE}$ 212 is less than the logic input threshold $V_{LTH}$.

In the example of FIG. 2, when the voltage $V_{SENSE}$ 212 is negative and the ENABLE signal 255 at the input to AND gate 250 is at a high logic level, clamp circuit 272 conducts a clamp current $I_{CLAMP}$ 295 through transistors $Q_{HV2}$ 262 and $Q_{LV}$ 264. Transistors $Q_{HV2}$ 262 and $Q_{LV}$ 264 in the clamp circuit 272 are designed to conduct clamp current $I_{CLAMP}$ 295 at a voltage that is not sufficient to forward bias the substrate diode of the integrated circuit 205. Therefore, the clamp circuit 272 prevents the substrate diode from becoming forward biased when the voltage $V_{SENSE}$ 212 is negative.

Figure 3:
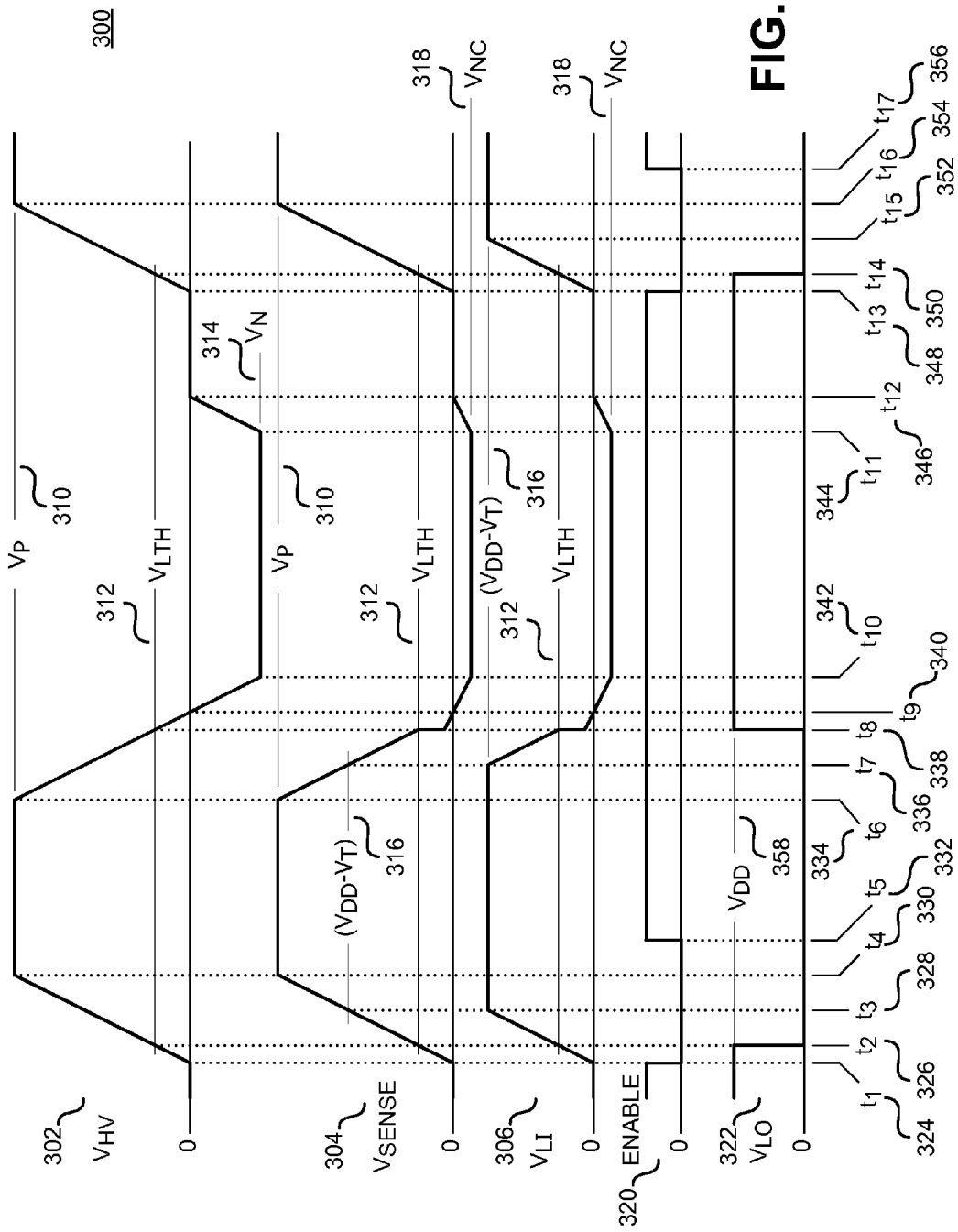
FIG. 3 is a timing diagram showing example waveforms that illustrate the operation of the example circuit of FIG. 2 in accordance with the teachings of the present invention.

FIG. 3 is a timing diagram 300 that shows example waveforms for the operation of the example circuits of FIG. 2 in accordance with the teaching of the present invention. The example waveforms of FIG. 3 are not drawn to scale and may have some features exaggerated to reveal specific details in accordance with the teachings of the present invention.

The timing diagram of FIG. 3 shows an example waveform 302 of a time-varying voltage from the voltage source $V_{HV}$ 210 of FIG. 2, an example waveform 304 of the voltage $V_{SENSE}$ 212 in FIG. 2, an example waveform 306 of the voltage $V_{LI}$ 216 at the input 280 of logic inverter 275 in FIG. 2, an example waveform 320 of the ENABLE signal 255 at the input to AND gate 250 in FIG. 2, and an example waveform 322 of the voltage $V_{LO}$ 214 at the output 285 of logic inverter 275 in FIG. 2.

FIG. 3 shows the waveforms of $V_{HV}$ 302, $V_{SENSE}$ 304, and $V_{LO}$ 306 at zero volts before time $t_1$ 324. FIG. 3 also shows the waveform 320 of ENABLE signal 255 at a high logic level and the waveform of $V_{LO}$ 322 at the high logic level of $V_{DD}$ 358 before time $t_1$ 324. At time $t_1$ 324, the voltage from voltage source $V_{HV}$ 210 (302) and the voltage $V_{SENSE}$ 212 (304) begin to increase linearly toward a maximum voltage $V_P$ 310 at time $t_4$ 330. Voltage $V_{LI}$ 216 (306) at the input 280 of logic inverter 275 also increases as $V_{SENSE}$ 212 (304) increases until time $t_3$ 328 when the voltage $V_{LI}$ 216 (306) reaches a value 316 that is a transistor threshold voltage $V_T$ below the regulated voltage $V_{DD}$ 245.

The example of FIG. 3 also shows that at time $t_1$ 324 ENABLE signal 255 (320) transitions from a logic high level to a logic low level to prevent the clamp circuit 272 from conducting, allowing the voltage $V_{SENSE}$ 212 (304) to increase. ENABLE signal 255 (320) transitions from a logic low level to a logic high level at time $t_5$ 332 after voltage $V_{SENSE}$ 212 (304) reaches its maximum value $V_P$ 310.

When the voltage $V_{LI}$ 216 (306) at the input 280 of logic inverter 275 reaches the logic threshold $V_{LTH}$ 312 at time $t_2$ 326, voltage $V_{LO}$ 214 at the output 285 of logic inverter 275 goes from a logic high level of $V_{DD}$ 358 to a logic low level of zero. Therefore, the example of FIG. 3 shows that the detector 270 provided a logic signal to indicate that the voltage $V_{SENSE}$ 212 (304) increased to reach the logic threshold value of $V_{LTH}$ at time $t_2$ 326.

FIG. 3 shows at time $t_6$ 334 the voltage from voltage source $V_{HV}$ 210 (302) begins to decrease linearly from a positive value $V_P$ 310 toward a negative value $V_N$ 314. Voltage $V_{SENSE}$ 212 (304) also begins to decrease linearly at time $t_6$ 334. The voltage $V_{LI}$ 216 (306) at the input 280 of logic inverter 275 remains constant between time $t_3$ 328 and time $t_7$ 336 at a value 316 that is a transistor threshold voltage $V_T$ below the regulated voltage $V_{DD}$ 245. The voltage $V_{LI}$ 216 (306) at the input 280 of logic inverter 275 begins to decrease at time $t_7$ 336 when the voltage $V_{SENSE}$ 212 (304) falls below the value of the regulated voltage $V_{DD}$ 254 minus the threshold voltage $V_T$.

The example of FIG. 3 shows the voltage $V_{LI}$ 216 (306) at the input 280 of logic inverter 275 continues to decrease after time $t_7$ 336 in response to the decrease in the voltage from voltage $V_{SENSE}$ 212 (304) that results from the decrease in voltage 302 from voltage source $V_{HV}$ 210. When the voltage $V_{LI}$ 216 (306) at the input 280 of logic inverter 275 becomes less than the logic threshold voltage $V_{LTH}$ 312 at time $t_8$ 338, the voltage $V_{LO}$ 214 at the output 285 of logic inverter 275 transitions from a logic low level of zero to a logic high level $V_{DD}$ 358. Therefore, the example of FIG. 3 shows that the detector 270 provided a logic signal to indicate that the voltage $V_{SENSE}$ 212 (304) decreased to become less than the logic threshold value of $V_{LTH}$ 312 at time $t_8$ 338.

The waveforms in the example of FIG. 3 show that the voltage $V_{SENSE}$ 212 (304) at terminal HVS 225 and the voltage $V_{LI}$ 216 (306) at the input 280 of logic inverter 275 fall abruptly at time $t_8$ 338 when clamp circuit 272 conducts. The voltage from source $V_{HV}$ 210 (302), the voltage $V_{SENSE}$ 212 (304), and the voltage $V_{LI}$ 216 (306) all cross zero volts at time $t_9$ 340.

In the example of FIG. 3, waveform 302 of the voltage from voltage source $V_{HV}$ 210 reaches its most negative value $V_N$ 314 at time $t_{10}$ 342. Also at time $t_{10}$ 342, voltages $V_{SENSE}$ 212 (304) and $V_{LI}$ 216 (306) at the input 280 of logic inverter 275 reach the negative clamped voltage $V_{NC}$ 318 that is not sufficiently negative to forward bias the substrate diode of the integrated circuit. The three voltages start to become less negative at time $t_{11}$ 344, reaching zero at time $t_{12}$ 346, and remain at zero until time $t_{13}$ 348. Transistors $Q_{HV2}$ 262 and $Q_{LV}$ 264 of clamp circuit 272 remain in their ON states until time $t_{13}$ 348 when ENABLE signal 255 (320) goes to a low logic level. The waveforms in the example of FIG. 3 show that the events at times $t_{14}$ 350, $t_{15}$ 352, $t_{16}$ 354, and $t_{17}$ 356 repeat the events at times $t_2$ 326, $t_3$ 328, $t_4$ 330 and $t_5$ 332 respectively.

The above description of illustrated examples of the present invention, including what is described in the Abstract, are not intended to be exhaustive or to be limitation to the precise forms disclosed. While specific embodiments of, and examples for, the invention are described herein for illustrative purposes, various equivalent modifications are possible without departing from the broader spirit and scope of the present invention. Indeed, it is appreciated that the specific example voltages, currents, frequencies, power range values, times, etc., are provided for explanation purposes and that other values may also be employed in other embodiments and examples in accordance with the teachings of the present invention.

What is claimed is:

1. An integrated circuit, comprising:
    a high voltage transistor having a first terminal, a second terminal and a control terminal, wherein the first terminal is coupled to sense a high voltage terminal of the integrated circuit and the control terminal coupled to an internal regulated voltage terminal of the integrated circuit, wherein a regulated voltage at the internal regulated voltage terminal is regulated with respect to a ground terminal of the integrated circuit and is substantially less than a high voltage that the high voltage terminal is adapted to withstand;
    a logic gate having an input terminal and an output terminal, wherein the logic gate is coupled to be powered from the internal regulated voltage terminal, wherein the logic gate has an input threshold voltage that is less than the regulated voltage, wherein the input terminal of the logic gate is coupled to the second terminal of the high voltage transistor, wherein the output of the logic gate is coupled to indicate that a voltage sensed between the high voltage terminal and the ground terminal is less than the input threshold voltage of the logic gate; and
    a clamp circuit coupled between the high voltage terminal and the ground terminal, wherein the clamp circuit conducts current when the voltage sensed between the high voltage terminal and the ground terminal is less than the input threshold voltage of the logic gate.

2. The integrated circuit of claim 1 wherein the high voltage that the high voltage terminal is adapted to withstand is more than 30 volts between the high voltage terminal and the ground terminal.

3. The integrated circuit of claim 1 wherein the input threshold of the logic gate is less than 2 volts.

4. The integrated circuit of claim 1 wherein the regulated voltage at the internal regulated voltage terminal is approximately 5.8 volts.

5. The integrated circuit of claim 1 wherein the regulated voltage at the internal regulated voltage terminal is approximately 4.4 volts.

6. The integrated circuit of claim 1 wherein the first terminal of the high voltage transistor is a drain of a field effect transistor coupled to the high voltage terminal.

7. The integrated circuit of claim 1 wherein the second terminal of the high voltage transistor is a source of a field effect transistor coupled to the input terminal of the logic gate.

8. The integrated circuit of claim 1 wherein the control terminal of the high voltage transistor is a gate of a field effect transistor coupled to the internal regulated voltage terminal.

9. The integrated circuit of claim 1 wherein the high voltage terminal of the integrated circuit is coupled to receive a time-varying voltage that has positive and negative polarities between the high voltage terminal and the ground terminal.

10. The integrated circuit of claim 1 wherein the integrated circuit further comprises a control circuit for use in a power supply.

11. The integrated circuit of claim 1 wherein the logic gate comprises an inverter.

12. A voltage detector circuit, comprising:
    a high voltage terminal of an integrated circuit;
    a ground terminal of the integrated circuit, wherein an internal voltage of the voltage detector circuit is regulated with respect to the ground terminal; and
    a voltage sensing circuit including a field effect transistor coupled to a logic gate, wherein the voltage sensing circuit is coupled to the high voltage terminal and to the ground terminal to detect a voltage between the high voltage terminal and the ground terminal, wherein the detected voltage between the high voltage terminal and the ground terminal is less than an input threshold of the logic gate, wherein the integrated circuit is adapted to operate with more than 30 volts between the high voltage terminal and the ground terminal, and wherein the input threshold of the logic gate is less than 2 volts, and further wherein the integrated circuit further includes a clamp circuit coupled to the high voltage terminal, wherein the clamp circuit is coupled to conduct current when the voltage at the high voltage terminal is less than the input threshold of the logic gate.

13. The voltage detector circuit of claim 12 wherein a drain of the field effect transistor is coupled to receive a voltage on the high voltage terminal, wherein a gate of the field effect transistor is coupled to receive the internal voltage of the voltage detector circuit that is regulated with respect to the ground terminal, and wherein a source of the field effect transistor is coupled to an input of the logic gate.

14. The voltage detector circuit of claim 12 wherein the voltage detector circuit is coupled to receive a time-varying voltage that has positive and negative polarities between the high voltage terminal and the ground terminal.

15. The voltage detector circuit of claim 12 wherein the integrated circuit further includes a control circuit for use in a power supply.

16. The voltage detector circuit of claim 12 wherein the logic gate comprises an inverter.

\* \* \* \* \*